United States Patent
Her et al.

(10) Patent No.: US 6,650,009 B2
(45) Date of Patent: Nov. 18, 2003

(54) STRUCTURE OF A MULTI CHIP MODULE HAVING STACKED CHIPS

(75) Inventors: Tzong-Dar Her, Taichung (TW); Randy H. Y. Lo, Tan-Tzu Hsiang (TW); Chien-Ping Huang, Hsinchu Hsien (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 10/206,720

(22) Filed: Jul. 26, 2002

(65) Prior Publication Data

US 2002/0180023 A1 Dec. 5, 2002

Related U.S. Application Data

(62) Division of application No. 09/654,814, filed on Sep. 5, 2000.

(30) Foreign Application Priority Data

Jul. 18, 2000  (TW) ........................................ 89114320 A

(51) Int. Cl.⁷ ............................................... H01L 23/02
(52) U.S. Cl. ...................... 257/686; 723/777; 723/724; 723/778; 723/738; 723/783
(58) Field of Search ............................. 257/686, 723, 257/724, 777, 778, 783, 738, 784

(56) References Cited

U.S. PATENT DOCUMENTS

| | | | | |
|---|---|---|---|---|
| 4,996,583 A | * | 2/1991 | Hatada | 257/724 |
| 5,291,061 A | * | 3/1994 | Ball | 257/111 |
| 5,323,060 A | * | 6/1994 | Fogal et al. | 257/777 |
| 5,399,898 A | * | 3/1995 | Rostoker | 257/777 |
| 5,502,667 A | * | 3/1996 | Bertin et al. | 365/51 |
| 5,684,677 A | * | 11/1997 | Uchida et al. | 361/770 |
| 5,783,870 A | * | 7/1998 | Mostafazadeh et al. | 257/791 |
| 5,786,628 A | * | 7/1998 | Beilstein, Jr. et al. | 257/684 |
| 5,918,469 A | * | 7/1999 | Cardella | 62/3.7 |
| 6,005,778 A | * | 12/1999 | Spielberger et al. | 361/770 |
| 6,057,598 A | * | 5/2000 | Payne et al. | 257/723 |
| 6,080,931 A | * | 6/2000 | Park et al. | 257/723 |
| 6,100,593 A | * | 8/2000 | Yu et al. | 257/777 |
| 6,104,081 A | * | 8/2000 | Dekker et al. | 257/618 |
| 6,222,265 B1 | * | 4/2001 | Akram et al. | 257/723 |
| 6,229,217 B1 | * | 5/2001 | Fukui et al. | 257/777 |
| 6,239,366 B1 | * | 5/2001 | Hsuan et al. | 174/52.3 |
| 6,476,502 B2 | * | 11/2002 | Yamada et al. | 257/778 |
| 6,558,978 B1 | * | 5/2003 | McCormick | 438/108 |

\* cited by examiner

*Primary Examiner*—David Nelms
*Assistant Examiner*—Andy Huynh
(74) *Attorney, Agent, or Firm*—J.C. Patents

(57) ABSTRACT

A structure of a multi chip module package having stacked chips, having at least a substrate, a main chip, a plurality of chip sets, a plurality of spacers, a plurality of glue layers, a plurality of wires, and a mold compound. The substrate has a front surface and a back surface opposite to the front surface. A plurality of chips are stacked in the form of laminate on the front surface of the substrate to form a plurality of chip sets, which are located next to the main chip. A plurality of spacers are arranged between each two adjacent chips. The connection between the spacers, the main chip, the chips, and the substrate are achieved by a plurality of glue layers. A plurality of wires are used to electrically connect the chips and the main chip to the substrate. Finally, the front surface of the substrate, the main chip, the spacers, the chips, and the glue layers are encapsulated with a mold compound to accomplish the package.

18 Claims, 5 Drawing Sheets

STRUCTURE OF A MULTI CHIP MODULE HAVING STACKED CHIPS

CROSS-REFERENCE TO RELATED APPLICATION

This is a divisional of the application Ser. No. 09/654,814, filed on Sep. 5, 2000.

BACKGROUND OF THE INVENTION

1. Field of the Invention

The present invention relates to a structure of multi chip module having stacked chips. More specifically, the present invention relates to a structure of multi chip module package having stacked chips for semiconductor devices.

2. Description of the Related Art

In the current world full of information, integrated circuits play an important role in daily life. With increasing development in electronics, electronic products are more user friendly and exhibit higher performance. Products are designed such that the features are lighter and more compact. In the semiconductor fabricating process, a semiconductor product having higher integration is possible because of mass production of 0.18 micrometers integrated circuits.

In general, the production of the integrated circuit (IC) includes three stages: silicon wafer production, IC production and IC packaging.

Various technologies for packaging have been developed as competition in the industry has increased. Many fine packages such as chip scale package (CSP), wafer level package or multi chip module (MCM) are manufactured. In the assembly of devices, a multi-level PCB having higher density can be used to allow the IC package to be arranged on the PCB more compactly.

The current package for the integrated circuit has been developed to incorporate a Read Only Memory (ROM), a Static Random Access Memory (SRAM), a flash memory or a Dynamic Random Access Memory (DRAM), a Logic Circuit, and a digital circuit on a chip, so called as System On Chip (SOC) to satisfy the demand for light weight, compact size and perfect performance. An embedded ROM is one of examples of the circuit having both a flash memory and a logic circuit.

However, in the conventional system on chip (SOC), a plurality of chips, such as DRAM, flash memory, Logic Circuit and radio frequency (RF) devices, are incorporated on a chip. Although the functionality and electric property thereof can be thus enhanced, it is more complicate to design a layout in circuit connection. Since the fabricating methods of devices having various functions are different from each other, the integration of devices having various functions becomes complex, resulting in reduced yield and increased cost for fabrication.

Referring to FIG. 1A, a conventional structure for multi chip module package is shown. FIG. 11B is cross sectional view of FIG. 1A taken along 1B—1B.

As shown in FIGS. 1A and 11B, a multi chip module (MCM) package is used as an alternative. A main chip 105, a first chip 106 and a second chip 108 are arranged side-by-side on a substrate 102. The connection of the main chip 105, the first chip 106 and the second chip 108 to the substrate 102 is achieved by a glue layer 104. Wire bonding is subsequently performed to electrically connect the main chip 105, the first chip 106, the second chip 108 to the substrate 102 by wires 110. The main chip 105, the first chip 106, the second chip 108 and the wires 110 are encapsulated with a mold compound 114. Finally, solder balls are mounted thereon to complete a structure for the multi chip module package.

Referring to FIG. 2A, a plan view of another conventional structure of multi chip module package is shown. FIG. 2B is a cross sectional view of FIG. 2A along 2B—2B.

As shown in FIGS. 2A and 2B, a main chip 205, a first chip 206, a second chip 208, a third chip 209 and a fourth chip 207 are arranged side-by-side on a substrate 202. The connection of the main chip 205, the first chip 206, the second chip 208, the third chip 209 and the fourth chip 207 to the substrate is achieved by a glue layer 204. Wire bonding is subsequently preformed to electrically connect the main chip 205, the first chip 206, the second chip 208, the third chip 209 and the fourth chip 207 to the substrate 202 by wires 210. The main chip 205, the first chip 206, the second chip 208, the third chip 209 and the fourth chip 207, the substrate 202 and the wires 210 are encapsulated with a mold compound 214. Finally, solder balls are mounted thereon to complete a structure of multi chip module package. The conventional structure of multi chip module package is characterized in that devices with multifunctions are integrated into a package. The area occupied by the package devices is large to make routability of the substrate 202 complicate. A substrate 202 having high junction density is, thus, desirably used. The side-by-side arrangement of the main chip 205, the first chip 206, the second chip 208, the third chip 209 and the fourth chip 207 influence the amount of chips accommodated in the multi chip module package. The integration can, thus, be affected to result in increased cost and reduced performance.

SUMMARY OF THE INVENTION

Therefore, it is an object of the present invention to provide a structure of multi chip module package for stacking support chip and having substantially the same size.

It is another object of the present invention to provide a structure for a multi-chip module package that has sufficient routability and stacked chips.

It is still another object of the present invention to provide a structure of multi chip module package that can incorporate more chips and can be used to stack the chips.

According to the above objects of the present invention, comprising at least: a substrate, a main chip, a plurality of chip sets, a plurality of spacers, a plurality of glue layers, a plurality of wires, and a mold compound. The substrate has a front surface and a back surface opposite to the front surface. A plurality of chips are stacked in the form of laminate on the front surface of the substrate to form a plurality of chip sets, which are located next to the main chip. A plurality of spacers are arranged between each two adjacent chips. The connection between the spacers, the main chip, the chips, and the substrate are achieved by a plurality of glue layers. A plurality of wires are used to electrically connect the chips and the main chip to the substrate. Finally, the front surface of the substrate, the main chip, the spacers, the chips, and the glue layers are encapsulated with a mold compound to accomplish the package.

According to a preferred embodiment of the present invention, a structure of multi chip module package having stacked chips is provided to stack memories, such as support chip, and decrease the area occupied by the package devices. The structure of the present invention can also stack chips having substantially the same size to incorporate with more chips to utilize the routability of the substrate more effectively, without the substrate of high junction density.

The layout of the side-by-side chips can, thus, be improved to accommodate more stacked chips for the multi chip module package. It leads to enhanced integration which reduces the cost for manufacturers and obtains improved performance.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1A:
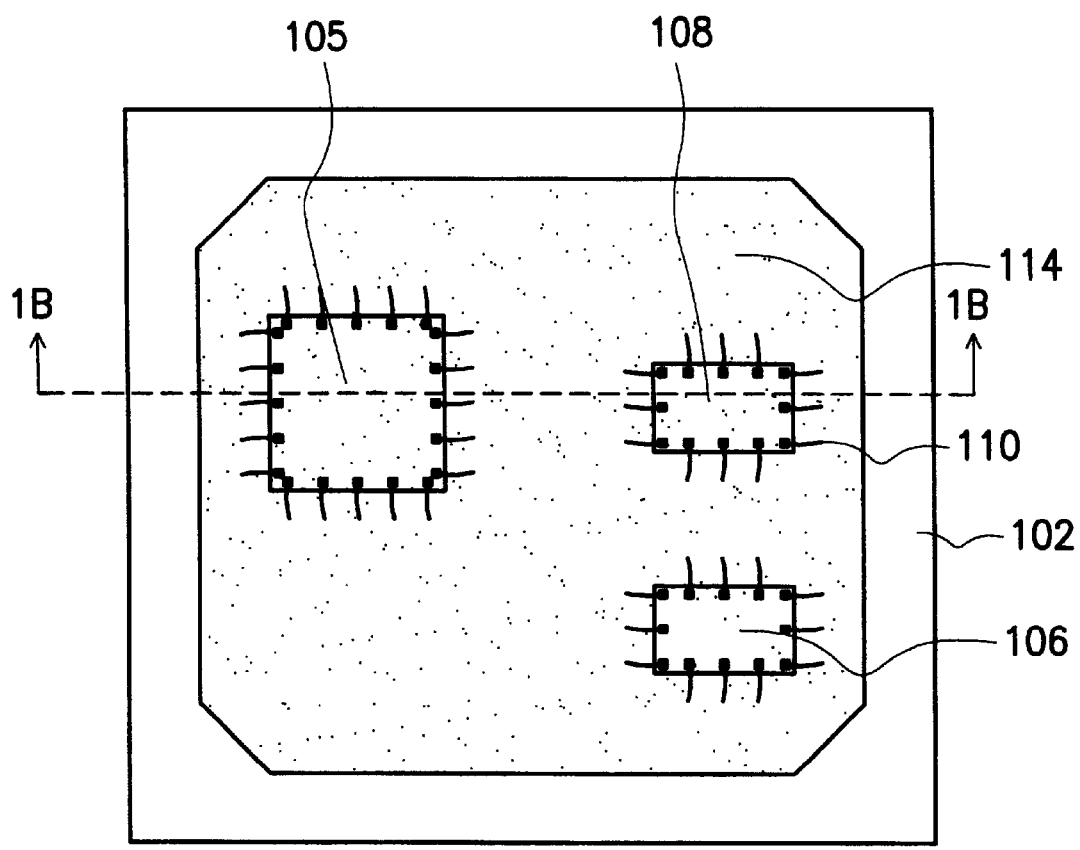
FIG. 1A is a plan view of a conventional structure of multi chip module package.
Figure 1B:
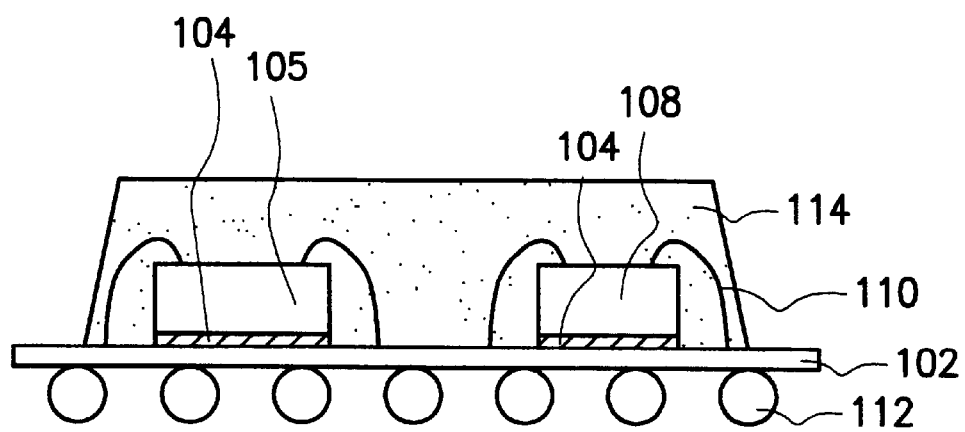
FIG. 1B is a cross sectional view of a conventional structure of multi chip module package.
Figure 2A:
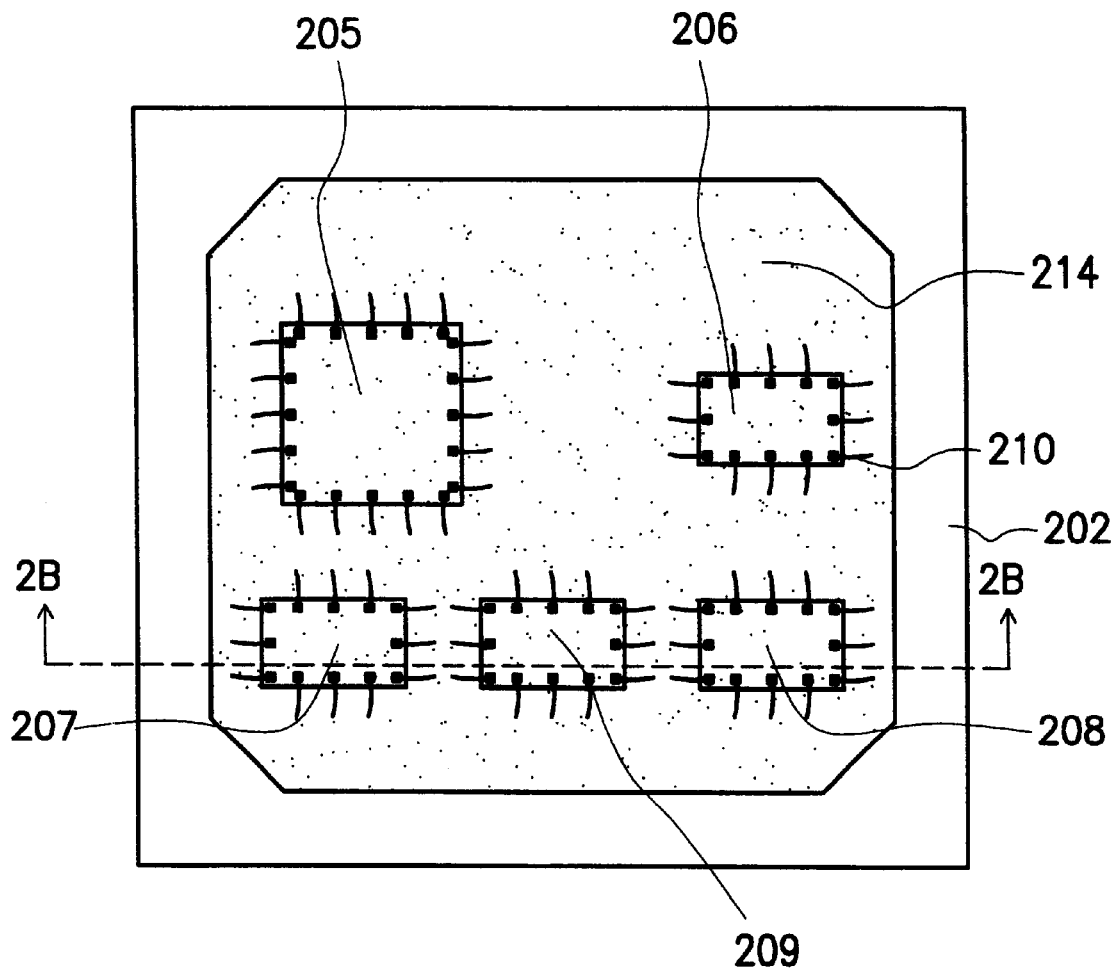
FIG. 2A is a plan view of another conventional structure of multi chip module package.
Figure 2B:
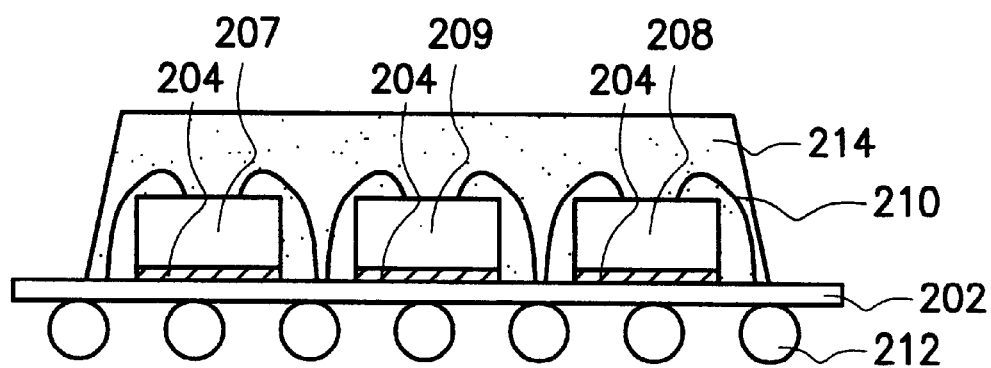
FIG. 2B is a cross sectional view of another conventional structure of multi chip module package.
Figure 3A:
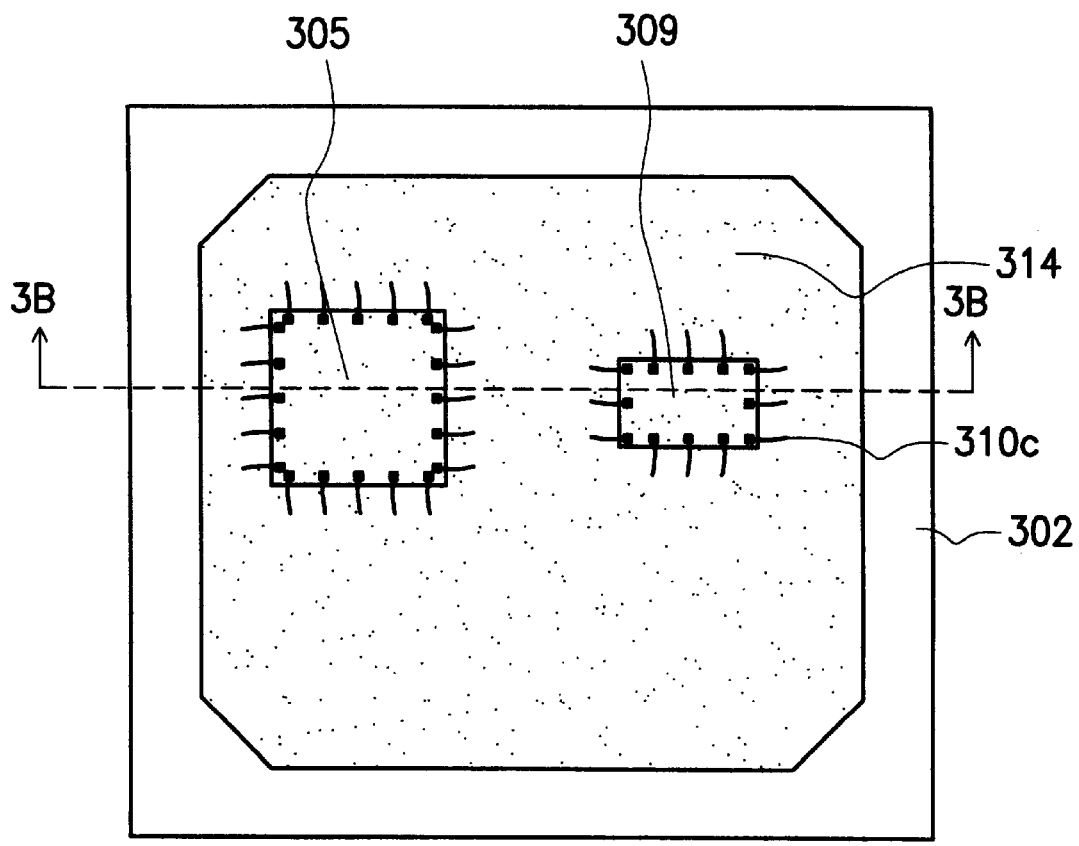
FIG. 3A is a plan view of a structure of multi chip module package having stacked chips according to the first preferred embodiment of the present invention.
Figure 3B:
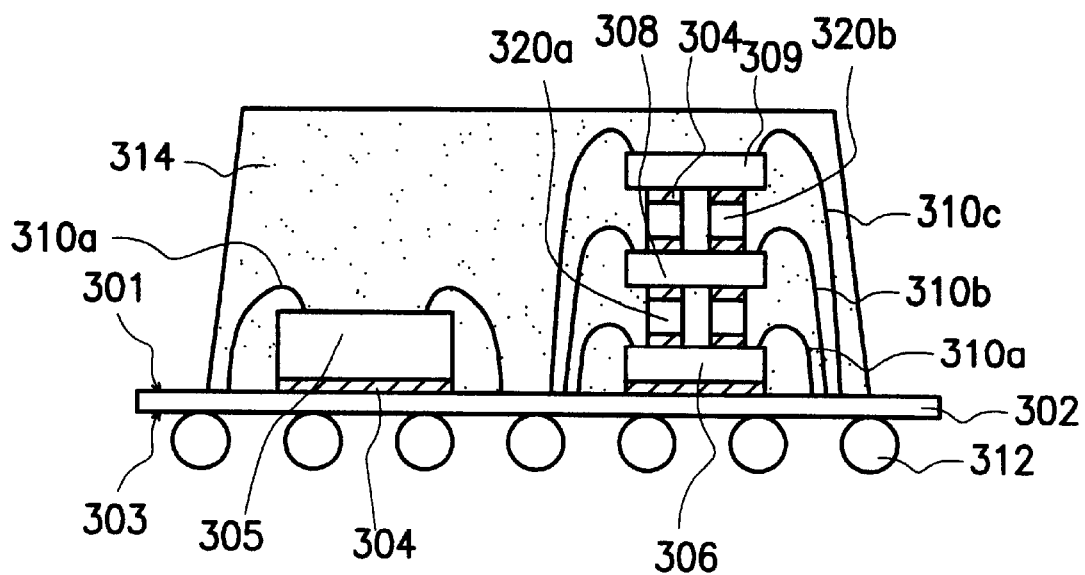
FIG. 3B is a cross sectional view of a structure of multi chip module package having stacked chips according to the first preferred embodiment of the present invention.

Referring to FIGS. 3A 3B, a plan view of a structure of multi chip module package having stacked chips according to the first preferred embodiments of the present invention are shown. FIG. 3B is a cross sectional view of FIG. 3A along 3B—3B.

As shown in FIGS. 3A and 3B, a substrate 302 has a front surface 301 and a back surface 303 opposite to the front surface 301. A first chip 306, a second chip 308, and a third chip 309, such as memory chips, are provided with substantially the same size. First, a main chip 305, such as a graphic chip, and the first chip 306 are provided on the front surface 301 of the substrate 302, all of which are electrically connected to the substrate 302 by wires 310a, respectively. Then, the second chip 308 is stacked on the first chip 306 and a spacer 320a. The second chip 308 is electrically connected to the substrate 302 by wires 310b. Provided on the second chip 308 is a spacer 320b. On the first chip 306, the second chip 308 and the spacer 320b, the third chip is provided. The third chip 309 is electrically connected to the substrate 302 by wires 310c.

The spacer can be the form of column to decrease the cost of the material used and also to lift up the second chip 308 and the third chip 309. The connection between the spacers 320a and 320b, the first chip 306, the second chip 308, the third chip 309 and the substrate 302 can be achieved by a plurality of glue layers. The materials used for the glue layers include epoxy resin, or the materials that are heat conductive but are not electrical conductive. It doesn't need to use polyimide as stacked spacers to increase the temperature up to 400° C., as disclosed in U.S. Pat. No. 5,291,061. Thereby, the process can be simplified and the cracks of the first chip, the second chip, and the third chip caused by high temperature connection can be avoided. Furthermore, when the wire bonding for the wires 310a, 310b, and 310c is accomplished by ultrasonic process, the cushion effect generated from insufficient rigidity of the second chip 308 or the third chip 309, as disclosed in the previous prior art, can be prevented to increase the yield.

Subsequently, the front surface of the substrate 302, the spacers 320a and 320b, the first chip 306, the second chip 308, and the third chip 309 are encapsulated with a mold compound 314. The glue layers 304 can be also contained therein. The mold compound 314 includes insulating materials, such as epoxy resin. Finally, solder balls can be mounted on the back surface 303 of the substrate 302 to provide the performance of Input/Output. The spacers 320a and 320b include silicon having good heat dissipation, dummy chip, or other metals having coefficient of thermal expansion (CTE) similar or nearly equivalent to that of the first chip 306, the second chip 308 and the third chip 309, such that the problems with regard to thermal stress would not be generated.

Figure 4A:
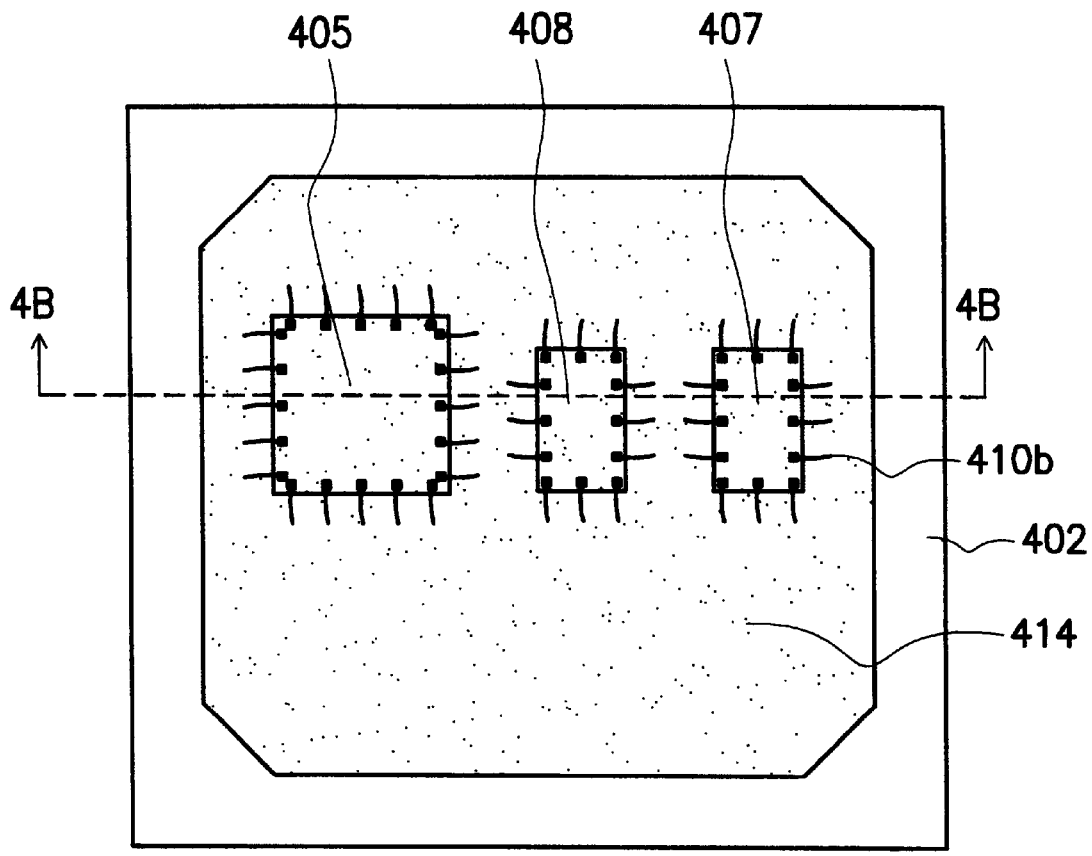
FIG. 4A is a plan view of a structure of multi chip module package having stacked chips according to the second preferred embodiment of the present invention.
Figure 4B:
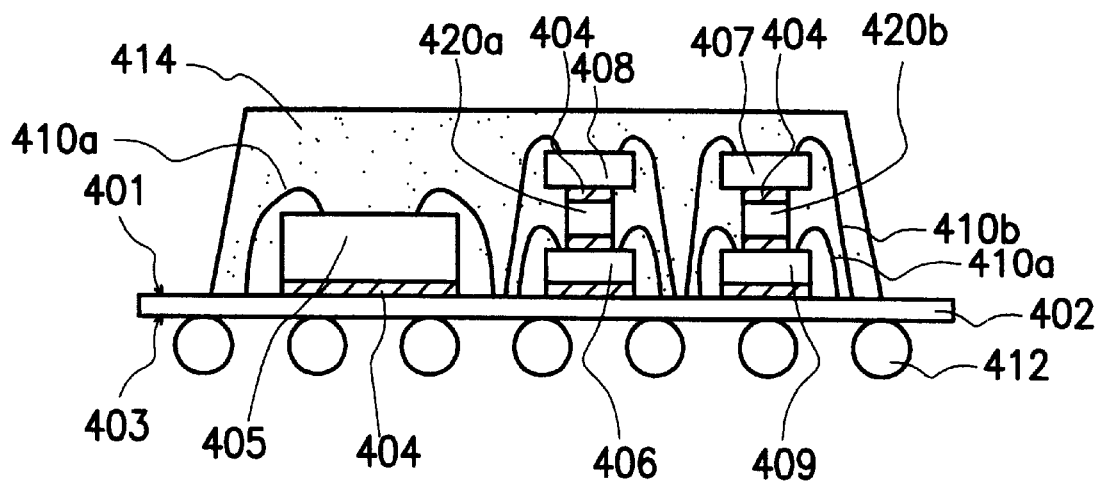
FIG. 4B is a cross sectional view of a structure of multi chip module package having stacked chips according to the second preferred embodiment of the present invention.

Referring to FIG. 4A, a plan view of a structure of a stacked package according to the second preferred embodiment of the present invention is shown. Referring to FIG. 4B, a cross sectional view of a structure of a stacked package according to the second preferred embodiment of the present invention is shown. FIG. 4B is a cross sectional view along 4B—4B in FIG. 4A.

As shown in FIGS. 4A and 4B, a substrate 402 has a front surface 401 and a back surface 403 opposite to the front surface 401. A first chip 406 and a second chip 408 are provided with essentially the same size. A third chip 409 and a fourth chip 407 are provided with substantially the same size. First, a main chip 405, such as a graphic chip, the first chip 406 and the third chip 409 are provided on the front surface 401 of the substrate 402, all of which are electrically connected to the substrate 402 by wires 410a, respectively. On the first chip 406 and the third chip 409, spacers 420a and 420b are provided. Then, the second chip 408 is stacked on the first chip 406 and the spacer 420a, and the fourth chip 407 is stacked on the third chip 409 and the spacer 420b. The second chip 408 and the fourth chip 407 are electrically connected to the substrate 302 by wires 410b, respectively. The spacers 420a and 420b can be the form of column or plate. The connection between the spacers 420a and 420b, the first chip 406, the second chip 408, the third chip 409, the fourth chip 407 and the substrate 402 can be achieved by a plurality of glue layers 404. Subsequently, the front surface 401 of the substrate 402, the spacers 420a and 420b, the first chip 406, the second chip 408, the third chip 409 and the fourth chip 407 are encapsulated with a mold compound 414. The glue layers 404 can be also contained therein. Finally, solder balls are mounted on the back surface 403 of the substrate 402.

Figure 5:
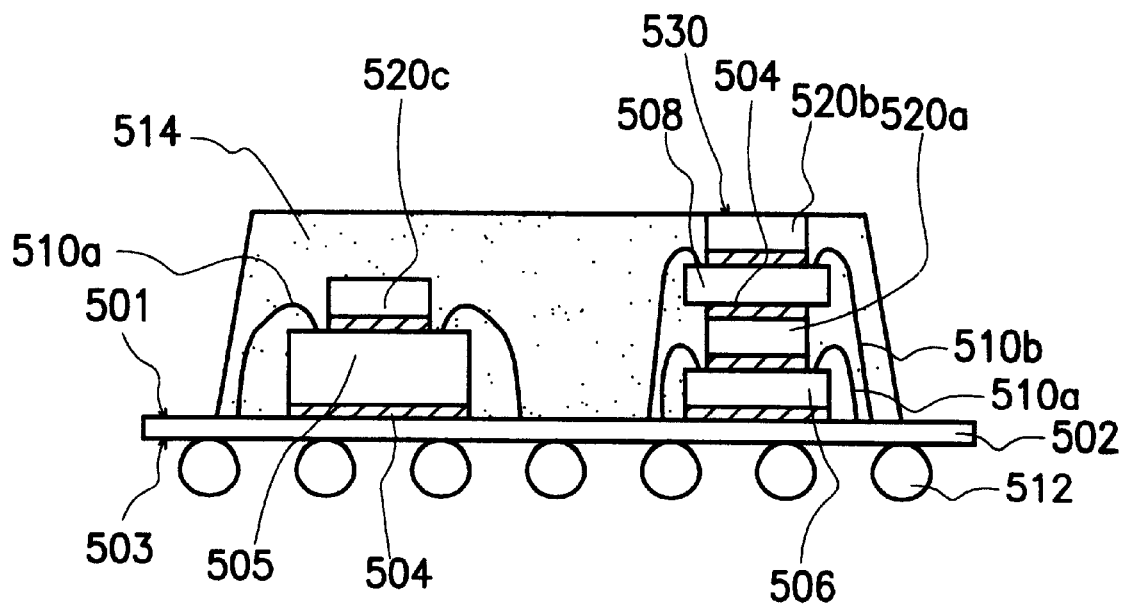
FIG. 5 is a cross sectional view of a structure of multi chip module package having stacked chips according to the third preferred embodiment of the present invention.

As shown in FIG. 5, a substrate 502 has a front surface 501 and a back surface 503 opposite to the front surface 501. A first chip 506 and a second chip 508 are provided with substantially the same size. First, a main chip 505 and the first chip 506 are provided on the front surface 501 of the substrate 502, both of which are electrically connected to the substrate 502 by wires 510a, respectively. A spacer 520a is provided on the first chip 506. Then, the second chip 508 is stacked on the first chip 506 and the spacer 520a. The second chip 508 is electrically connected to the substrate 502 by wires 510b. Provided on the second chip 508 is a spacer 520b. On the main chip 505, a spacer 520c is provided. The spacer 520b includes at least a heat dissipating surface 530. The connection between the spacers 520a, 520b and 520c, the first chip 506, the second chip 508 and the substrate 502 is achieved by a plurality of glue layers 504.

The front surface 501 of the substrate 502, the spacers 520a, 520b and 520c, the main chip 505, the first chip 506, the second chip 508 are encapsulated with a mold compound 514. The glue layer 504 is also contained therein, exposing the heat dissipating surface 530 of the spacer 520b. Finally, solder balls 512 are mounted on the back surface 503 of the substrate 502. Good heat-dissipating effect can be obtained by exposing the heat dissipating surface 530 of the spacer, because of superior heat conductivity of the spacers 520a, 520b and 520c.

Figure 6:
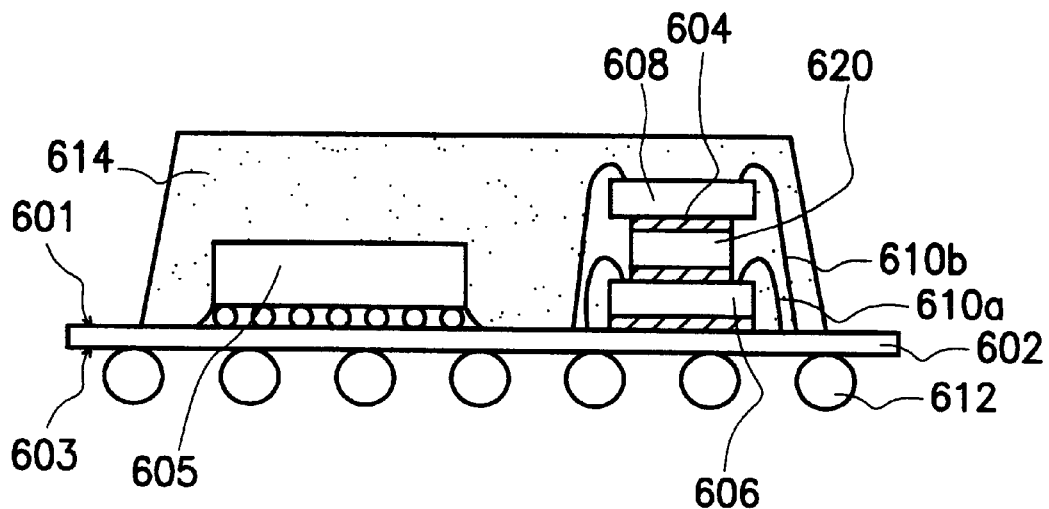
FIG. 6 is a cross sectional view of a structure of multi chip module package having stacked chips according to the fourth preferred embodiment of the present invention.

As shown in FIG. 6, a substrate 602 has a front surface 601 and a back surface 603 opposite to the front surface 601. Alternatively, a main chip 605, such as graphic chip, can be provided on the front surface 601 of the substrate 602 by flip chip technology. First, the first chip 606 is provided on the front surface 601 of the substrate 602. The first chip 606 is electrically connected to the substrate 602 by wires 610a. On the first chip, a spacer 620 is provided. Then, a second chip 608 is stacked on the first chip 606 and the spacer 620. The first chip 606 can be slightly larger or smaller than a second chip 608, with a deviation of smaller than 0.3 mm. The second chip 608 is electrically connected to the substrate 602 by wires 610b. The connection between the spacer 620, the first chip 606, the second chip 608 and the substrate 602 is achieved by a plurality of glue layers 604. Subsequently, the front surface 601 of the substrate 602, the spacers 620, the main chip 605, the first chip 606, the second chip 608 are encapsulated with a mold compound 614. The glue layers 604 are also contained therein. Finally, solder balls 612 are mounted on the back surface 603 of the substrate 602.

As mentioned above, the present invention has the following advantages:

1. Chips (e.g. memory chips) can be stacked to minimize the space occupied by the packaging devices.
2. Chips having similar size can be stacked to integrate with more chips. It can utilize the layout of the substrate more effectively, without use of a substrate having multi junctions of high density
3. The layout located between chips side-by-side can be improved to accommodate stacked chips of the multi chip module. It can further enhance the integration to reduce the production cost.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A structure of multi-chip module package having stacked chips, comprising:

a substrate having a front surface and a back surface opposite to the front surface;

a graphic chip arranged on the front surface of the substrate;

a plurality of chip sets, arranged proximate to the graphic chip, each set of chips including a plurality of memory chips that are stacked in the form of laminate on the front surface of the substrate;

a plurality of spacers respectively arranged on the graphic chip and between two adjacently stacked memory chips in each chip set, wherein the spacers include at least a top heat dissipating spacer disposed on a top of the graphic chip and a top heat dissipating spacer disposed on a top of one chip set;

a plurality of glue layers attaching the spacers to the memory chips of the chip sets, attaching the chip sets to the substrate, and attaching the graphic chip to the substrate;

a plurality of wires electrically connecting the memory chips of the chip sets and the graphic chip to the substrate; and a mold compound covering the front surface of the substrate, the graphic chip, the spacers, the memory chips, and the glue layers, and exposing the top heat dissipating spacers on the chip sets.

2. The structure according to claim 1, wherein the back of the substrate further comprises a plurality of solder balls.

3. The structure according to claim 1, wherein the memory chips have approximately the same size.

4. The structure according to claim 1, wherein the size deviation between two adjacently stacked memory chips of one chip set are smaller than 0.3 mm.

5. The structure according to claim 1, wherein the spacer includes silicon.

6. The structure according to claim 1, wherein the spacer includes a dummy chip.

7. The structure according to claim 1, wherein the spacer positioned between the memory chips includes metal, and the coefficient of thermal expansion of the spacer is similar to that of memory chips.

8. The structure according to claim 1, wherein the spacer is in the form of a plate.

9. The structure according to claim 1, wherein the spacer is in the form of a column.

10. The structure according to claim 1, wherein the glue layer includes epoxy resin.

11. The structure according to claim 1, wherein the glue layers include materials that are thermally conductive and electrically non-conductive.

12. The structure according to claim 1, wherein the mold compound includes epoxy resin.

13. A structure of multi-chip module package having stacked chips, comprising:

a substrate having a front surface;

a graphic chip arranged on the front surface of the substrate;

a plurality of chip sets, arranged proximate to the graphic chip, each set of chips including a plurality of memory chips that are stacked in the form of laminate on the front surface of the substrate;

a plurality of spacers respectively arranged on the graphic chip and between two adjacently stacked memory chips in each chip set, wherein the spacers include at least a top heat dissipating spacer disposed on a top of the graphic chip and a top heat dissipating spacer disposed on a top of one chip set, the top heat dissipating spacers being made of either silicon or metal;

a plurality of glue layers attaching the spacers to the memory chips of the chip sets, attaching the chip sets to the substrate, and attaching the graphic chip to the substrate;

a plurality of wires electrically connecting the memory chips of the chip sets and the graphic chip to the substrate; and a mold compound covering the front surface of the substrate, the graphic chip, the spacers, the memory chips, and the glue layers, and exposing the top heat dissipating spacers on the chip sets.

14. A structure of multi-chip module package having stacked chips, comprising:

a substrate;

a graphic chip arranged on the substrate and electrically connected to the substrate;

at least one chip set including a plurality of memory chips that are stacked in the form of laminate on the substrate and the memory chips electrically connected to the substrate;

a mold compound covering the substrate, the graphic chip and the memory chips.

15. The structure according to claim 14, further comprising at least one spacer arranged between two adjacently stacked memory chips of the chip set.

16. The structure according to claim 15, wherein the spacer is made of silicon or metal.

17. The structure according to claim 14, further comprising at least one heat dissipating spacer disposed on a top of the chip set.

18. The structure according to claim 17, wherein the heat dissipating spacer is made of silicon or metal.

* * * * *